United States Patent [19]

Mimura et al.

[11] Patent Number: 4,994,566

[45] Date of Patent: Feb. 19, 1991

[54] PHTHALOCYANINE CRYSTAL, PROCESS FOR MANUFACTURE THEREOF AND ITS USE FOR ELECTROPHOTOGRAPHIC PHOTOSENSITIVE MATERIAL

[75] Inventors: Yoshikazu Mimura, Tokyo; Keiichi Takano, deceased, late of Kanagawa, by Isao Takano, legal representative; Tomohisa Gotou, Tokyo, all of Japan

[73] Assignee: NEC Corporation, Tokyo, Japan

[21] Appl. No.: 339,442

[22] Filed: Apr. 17, 1989

[30] Foreign Application Priority Data

Apr. 15, 1988 [JP] Japan ................................. 63-93051
Mar. 15, 1989 [JP] Japan ................................. 1-64801

[51] Int. Cl.$^5$ .............................................. C09B 47/04
[52] U.S. Cl. ...................................... 540/141; 430/78; 430/58
[58] Field of Search ...................... 540/141; 430/58, 78

[56] References Cited

U.S. PATENT DOCUMENTS 4,664,997  5/1987  Suzuki et al. .................. 540/141 X Primary Examiner—David Welsh
Attorney, Agent, or Firm—Sughrue, Mion, Zinn, Macpeak & Seas

[57] ABSTRACT

A new crystal form of a titanyl phthalocyanine compound is provided. This crystal form shows characteristic strong absorption peaks at $1,332\pm2$ cm$^{-1}$, $1,074\pm2$ cm$^{-1}$, $962\pm2$ cm$^{-1}$ and $783\pm2$ cm$^{-1}$ in an infrared absorption spectrum and/or characteristic strong peaks at 27.2°, 9.7° and 24.1° of Bragg's angle $2\theta$ in an X-ray diffraction spectrum and has very good dispersibility and stability in a solvent and also very good photoelectric conversion efficiency and so is very useful particularly as a charge generation agent highly sensitive in a semiconductor laser wavelength region as required in a photosensitive material for a highspeed high-definition printer. Such crystal form can be obtained by treating non-crystalline titanyl phthalocyanine with tetrahydrofuran.

5 Claims, 6 Drawing Sheets

PHTHALOCYANINE CRYSTAL, PROCESS FOR MANUFACTURE THEREOF AND ITS USE FOR ELECTROPHOTOGRAPHIC PHOTOSENSITIVE MATERIAL

BACKGROUND OF THE INVENTION

1. Field of the Invention

The present invention relates to a titanyl phthalocyanine compound in a new crystal form a process for its manufacture and it use for a high sensitive photosensitive material for electrophotography.

2. Description of the Prior Art

It is well known that phthalocyanines particularly metalo-phthalocyanines have an excellent photoconductive property and some of them are usable for an electrophotographic photosensitive material.

Recently, non-impact printer technique attained a great development and consequently photoprinters of electrophotography system, which enable to obtain a high definition and a high speed by using a laser beam or an LED as a light source, are now widely spreading in the market. Therefore, intensive research and development are made to try to obtain photosensitive materials which satisfy requirements of such photoprinters.

Particularly when a laser beam is used as a light source, there is a need to obtain a photosensitive material having a photosensitivity up to a near infrared region. It is because mostly a semiconductor laser apparatus is used owing to the merits of compactness, cheapness and simplicity, but their oscillation wavelength is now limited to a relatively longer wavelength range of a near infrared region. Accordingly, it is not appropriate to use conventional photosensitive materials, which have been used for electrophotographic copying machines and have a sensitivity in a visible region, for a semiconductor laser apparatus.

It is known that some organic materials satisfy the need as above mentioned. They are, for example, squaric acid methine dyes, indoline dyes, cyanine dyes, pyrylium dyes, polyazo dyes, phthalocyanine dyes, naphthoquinone dyes, etc. At present, however, the squaric acid methine dyes, indoline dyes, cyanine dyes and pyrylium dyes enable to obtain a longer wavelength range but are lacking in a utilizable stability, that is, repeating property; the polyazo dyes are difficult to obtain a longer wavelength range and also have disadvantages in its production; and naphthoquinone dyes have a problem in its sensitivity.

On the other hand, the phthalocyanine dyes have spectrum sensitivity peaks in the long wavelength region of not less than 600 nm, have high sensitivities and further change their spectrum sensitivities in accordance with the kinds of their center metals and their crystal forms. They are therefore considered as suitable for dyes for a semiconductor laser apparatus and so research and development of them are intensively conducted.

Among the phthalocyanine compounds studied hitherto, particularly as those showing high sensitivities in the long wavelength region of not less than 780 nm, there may be mentioned, x-type non-metalo-phthalocyanine, $\epsilon$-type copper phthalocyanine, vanadyl phthalocyanine, etc.

In order to obtain a higher sensitivity, it has been attempted to use a vacuum evaporated film of phthalocyanine as a charge generation layer to produce a laminated type photosensitive material. In effect, some phthalocyanines of relatively high sensitivities have been obtained by using metals of groups IIIa and IV of the periodic table as center metals. Such metalo-phthalocyanines are described in, for example, Japanese Paatent Laid-open Nos. 211,149/82, 148,745/82, 36,254/84, 44,054/84, 30,541/84, 31,965/84, 166,959/84, etc. Such organic photosensitive materials as above, however, necessarily become expensive, since the production of the vacuum evaporated film requires a high vacuum discharge apparatus and so a high cost of installations.

It has also been attempted to use a resin dispersion layer of phthalocyanine, in place of said vacuum evaporated film of phthalocyanine, as a charge generation layer and to make a coating of a charve transfer layer thereon to produce a composite type photosensitive material. As for such composite type photosensitive material, there may be mentioned, for example, the photosensitive material using non-metalo-phthalocyanine as described in Japanese Patent Laid-open No. 182639/83 and that using indium phthalocyanine as described in Japanese Patent Laid-open No. 155851/84. These two are relatively high sensitive photosensitive material, but the former has a default that its sensitivity rapidly reduces in a long wavelength region of not less than 800 nm, and the latter has a default that its sensitivity is not sufficient for utilization, when the charge generation layer is produced by means of the resin dispersion system.

It has also been attempted in these days to use titanyl phthalocyanines having relatively high sensitive electrophotographic properties as described in Japanese Patent Laid-open Nos. 49,544/84, 23,928/86, 109,056/86 and 275,272/87. According to these literatures, it is understood that their properties are different owing to their crystal forms and that in order to produce these various crystal forms, special purification and special solvent treatment are required. Further, the solvent to be used for such treatment is one that is different from the solvent to be used in forming the dispersion coating film. It is because the various crystals to be formed have tendency to easily grow in the solvent for the crystal growing treatment and so, if such solvent is used also as the solvent for the coating, it is difficult to control the crystal form and the particle size. This causes low stability of the coating material and eventually the electrostatic properties are significantly damaged. Therefore, ordinarily in the treatment of forming the coating material, a chlorine series solvent such as chloroform, which does not substantially promote the crystal growth, is used. This solvent however does not always show good dispersion property for the titanyl phthalocyanine and so causes some problems in the dispersion stability of the coating material.

SUMMARY OF THE INVENTION

An object of the present invention is, therefore, to solve the above mentioned problems and to provide a novel crystal form of a titanyl phthalocyanine compound showing good crystal stability and good dispersion in the solvent to be used in forming a coating material and further having good photosensitivity.

The present inventors have made intensive researches on the polymorphic transition behavior of titanyl phthalocyanine compounds for obtaining a utilizable highly sensitive charge generation agent free of the above mentioned problems and now succeeded in developing a new crystal form having very good solvent stability and dispersibility and very high photoelectric conversion efficiency to complete the present invention.

Thus the present invention provides a titanyl phthalocyanine compound having an excellent photoconductivity and showing a novel infrared absorption spectrum and/or a novel X-ray diffraction spectrum. This compound can be obtained by crystallizing a non-crystalline titanyl phthalocyanine compound from a solvent most suitable for dispersion, more particularly tetrahydrofuran. The titanyl phthalocyanine compound to be used in the present invention is one that can be represented by the general formula:

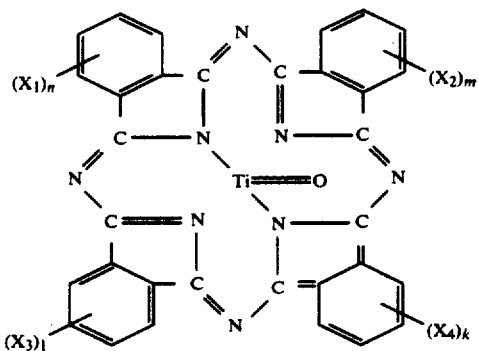

wherein $X_1$, $X_2$, $X_3$ and $X_4$ each independently represent various halogen atoms and n, m, l and k represent numerals of 0 to 4.

Particularly suitable compounds are the titanyl phthalocyanine [TiOPc], the titanyl chlorophthalocyanine [TiOPcCl] and their mixture.

The titanyl phthalocyanine compound to be used in the present invention can easily be synthesized by a method by itself known, for example, from 1,2-dicyanobenzene (o-phthalodinitrile) or its derivative and a metal or a metal compound. The synthesis routes may be shown as follows:

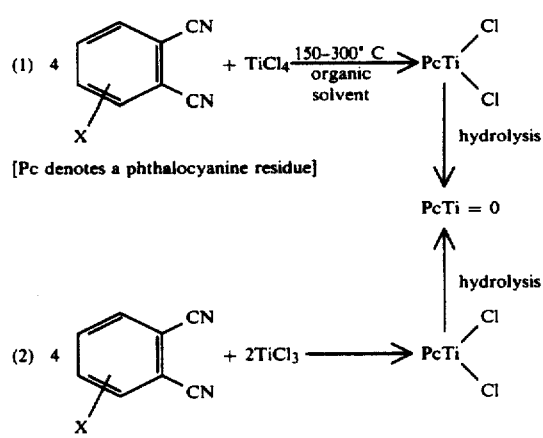

As for the organic solvent, a high boiling point organic solvent inert to the reaction, for example, nitrobenzene, quinoline, α-chloronaphthalene, β-chloronaphthalene, α-methylnaphthalene, methoxynaphthalene, diphenylether, diphenylmethane, diphenylethane, ethyleneglycol dialkylether, diethyleneglycol dialkylether, triethyleneglycol dialkylether, or the like is preferred. The preferable reaction temperature ordinarily is 150°–300° C and particularly 200°–250°

According to the present invention, the thus obtained crude titanyl phthalocyanine compound is subjected to a non-crystallization treatment and then to a tetrahydrofuran treatment. Before these treatments, it is preferable to remove the organic solvent used in the condensation reaction by using alcohols such as methanol, ethanol or isopropyl alcohol; or ethers such as tetrahydrofuran or 1,4-dioxane; and then to effect a hot water treatment. Particularly it is preferable to do washing until pH value of the washing liquor after the hot water treatment becomes about 5 to 7.

It is further preferable to subsequently effect a treatment with an electron donating solvent such as 2-ethoxyethanol, diglyme, dioxane, tetrahydrofuran, N,N-dimethylformamide, N-methylpyrrolidone, pyridine or morpholine.

The non-crystallization treatment may be performed by a single chemical or mechanical process, but preferably by combination of various processes.

For example, non-crystalline particles can be obtained by weakening aggregation of the particles by an acid pasting method, an acid slurry method or the like and then grinding the particles by any mechanical treating method. As for a grinding apparatus, a kneader, a Bumbury's mixer, an attritor, an edge runner mill, a roll mill, a ball mill, a sand mill, a SPEX mill, a homomixer, a disperser, an agitator, a jaw crusher, a stamp mill, a cutter mill, a micronizer, etc. may be used, but these apparatuses are only for examples and do not mean any limitation to the grinding apparatus to be used. The acid pasting method, which is well known as a chemical treatment process, is one to pour a pigment dissolved in concentrated sulfuric acid of not less than 95% or a pigment in the form of a sulfate into water or ice water to precipitate it for separation. It is possible to obtain non-crystalline particles in better conditions by maintaining the sulfuric acid and water preferably not higher than 5° C and by pouring the sulfuric acid slowly into water under highspeed stirring.

It is also possible to employ a method of grinding crystalline particles for a very long time by a direct mechanical treatment apparatus, a method of grinding the particles obtained by the acid pasting method after treatment by the solvent mentioned above, or the like. The non-crystalline particles may be obtained by sublimation. For example, the titanyl phthalocyanine compound obtained by any of the above mentioned processes is heated to 500°–600° C under vacuum to sublime it and deposit it on a substrate.

New stable crystal can be obtained by treating the non-crystalline titanyl phthalocyanine compound obtained as above mentioned, in tetrahydrofuran. The treatment in tetrahydrofuran is performed by stirring in any stirring apparatus 1 part by weight of non-crystalline titanyl phthalocyanine compound and 5–300 parts by weight of tetrahydrofuran. As for temperature, either heating or cooling is possible, and the crystal growth becomes rapid when heated and slow when cooled. As for the stirring apparatus, not only a usual stirrer but also a supersonic dispersing apparatus, a comminuting apparatus such as a ball mill, a sand mill, a homo-mixer, a disperser, an agitator or a micronizer, and a mixing apparatus such as a conical blender or a V-shape mixer may suitably be used. These stirring apparatuses are mentioned only for examples and do not limit the apparatus to be used. After the stirring treatment, ordinarily filtration, washing and drying treatments are carried out to obtain a stabilized crystal form of the titanyl phthalocyanine. It is also possible to omit the filtration and the drying treatments, whereby to obtain a coating material by adding, if necessary, resins, etc. to the dispersion. This is very effective to save process steps when the titanyl phthalocyanine crystal of the present invention is used as a coating film of an electrophotographic photosensitive material or the like.

The crystal form of the titanyl phthalocyanine of the present invention is new in respect of the fact that it shows, in infrared absorption, peaks at wave numbers (cm$^{-1}$) 1332, 1074, 962 and 783 (containing errors of ±2) as shown in the attached FIG. 1, which shows that it further has strong absorption peaks at wave numbers 729, 752, 895, 1059, 1120, 1288, 1490, etc. The new crystal form also shows, in an X-ray diffration using Cu-K$\bar{\alpha}$ ray, the strongest peak at 27.2° of Bragg's angle 2θ (containing errors of ±0.2°) and relatively strong peaks at 9.7° and 24.1° as shown in the attached FIGS. 2 and 6–11, which show that it further has characteristic peaks at 11.8°, 13.4°, 15.2°, 18.2°, 18.7°, etc.

On the other hand, a crystal form of the titanyl phthalocyanine compound obtained by a treatment with N-methyl pyrrolidone and that obtained by the acid pasting method [in accordance with the treatment process for obtaining an α-type phthalocyanine described in "Phthalocyanine Compounds" (1963) by Mozar and Thomas] have infrared spectra as shown in the attached FIGS. 3 and 4, and X-ray diffraction spectra as shown in the attached FIGS. 12 and 13, respectively. By comparing these FIGS. 3 and 4 with FIG. 1, and FIGS. 12 and 13 with FIGS. 2 and 6–11, it is clear that the crystal form of the titanyl phthalocyanine of the present invention is new.

It has been found that the above mentioned four strong specific peaks at wave numbers 1332, 1074, 962 and 783 of the infrared absorption and/or three strong specific peaks at 27.2°, 9.7° and 24.1° of X-ray diffraction Bragg's angle 2θ are common to the titanyl phthalocyanine compounds of the present invention, irrespectively of the absence or existence of halogen atoms and number and positions of substitution by halogen atoms.

The titanyl phthalocyanine compounds of the present invention do not show any significant changes in the infrared absorption spectrum or the X-ray diffraction spectrum, even if they are further heated and stirred in tetrahydrofuran to try to promote the crystal growth, and do not change into other crystal forms. They are therefore very stable and good crystals.

The photosensitive material may preferably be produced by laminating an undercoat layer, a charge generation layer, a charge transfer layer in this order on a conductive substrate. It is however also possible to produce it by laminating an undercoat layer, a charge transfer layer and a charge generation layer in this order or by coating an undercoat layer with a dispersion of a charge generating agent and a charge transfer agent in a suitable resin. The undercoat layer may as occasion demands be omitted. By applying a coating on a substrate with the use of the titanyl phthalocyanine compounds of the present invention as a charge generation agent along with a suitable binder, it is possible to obtain a charge generation layer which has very good dispersion property and very high photoelectric conversion efficiency.

The coating may be applied by means of a spin coater, an applicator, a spray coater, a bar coater, a dip coater, a doctor blade, a roller coater, a curtain coater, a bead coater, or the like so that a film having a thickness of 0.01–5 microns preferably 0.1–1 micron may be formed after drying. The drying is carried out preferably by heating at 40°–200° C for 10 min. to 6 hr. in the stationary or blown air.

The binder for use in forming a charge generation layer by coating may be selected from a wide scope of an insulating resin and also from an organic photoconductive polymer such as poly-N-vinylcarbazole, polyvinyl anthracene or polyvinyl pyrene. As for the insulating resin, polyvinyl butyral, polyarylate such as a polycondensate of bisphenol A and phthalic acid or the like, polycarbonate, polyester, phenoxy resin, polyvinyl acetate, acrylic resin, polyacrylamide resin, polyamide resin, polyvinyl pyridine, cellulosic resin, urethane resin, expoxy resin, sillicon resin, polystyrene, polyketone, polyvinyl chloride, copolymer of vinyl chloride and vinyl acetate, polyvinyl acetal, polyacrylonitrile, phenol resin, melamine resin, casein, polyvinyl alcohol, polyvinyl pyrrolidone, etc. may be mentioned. The amount of the resin to be incorporated into the charge generation layer is suitably not more than 100 weight % preferably not more than 40 weight %. Further, the resin may be used either singularly or in combination of two of more. The solvent for the resin is selected in accordance with the kind of the resin to be used preferably so that no bad influence may be given to the application of coatings of charge transfer layer and undercoat layer explained hereinafter. Such solvent is for example, an aromatic hydrocarbon such as benzene, xylene, ligroin, monochlorobenzene, dichlorobenzene or the like; a ketone such as acetone, methylethyl ketone, cyclohexanone or the like; an alcohol such as methanol, ethanol, isopropanol or the like; an ester such as ethyl acetate, methyl cellosolve or the like; an aliphatic halogenated hydrocarbon such as carbon tetrachloride, chloroform, dichloromethane, dichloroethane, trichloroethane, trichloroethylene or the like; an ether such as tetrahydrofuran, an amide such as N,N-dimethylformamide, N,N-dimethylacetoamide; and a sulfoxide such as dimethyl sulfoxide.

The electron transfer layer may be formed either singularly by a charge transfer agent or by a charge transfer agent dissolved or dispersed in a binding resin. As for the charge transfer agent, any known material can be used. The charge transfer agent includes an electron transfer material and a hole mobile material. As for the electron transfer material, an electron attractive material for example, chloroanil, bromoanil, tetracyanoethylene, tetracyanoquinodimethane, 2,4,7-trinitro-9-fluorenone, 2,4,5,7-tetranitro-9-fluorenone, 2,4,7-trinitro-9-dicyanomethylenefluorenone, 2,4,5,7-tetranitroxanthone, 2,4,8-trinitrothioxanthone, etc. or a high polymen of such electron attractive material may be mentioned.

As for the hole mobile material, pyrene, N-ethylcarbazole, N-isopropylcarbazole, N-methyl-N-phenylhydrazino-3-methylidene-9-ethylcarbazole, N,N-diphenylhydrazino-3-methylidene-9-ethylcarbazole, N,N-diphenylhydrazino-3-methylidene-10-ethylphenothiazine, N,N-diphenylhydrazino-3-methylidene-10-ethylphenoxazine, a hydazone such as p-diethylaminobenzaldehyde-N,N-diphenylhydrazone, p-diethylaminobenzaldehyde-N-α-naphthyl-N-phenylhydrazone, p-pyrrolidinobenzaldehyde-N,N-dipheylhydrazone, 2-methyl-4-dibenzylaminobenzaldehyde-1'-ethyl-1'-benzothiazolylhydrazone, 2-methyl-4-dibenzylaminobenzaldehyde-1'-propyl-1'-benzothiazolylhydrazone, 2-methyl-4-dibenzylaminobenzaldehyde-1',1'-dipheylhydrazone, 9-ethylcarbazole-3-carboxaldehyde-1'-methyl-1'-phenylhydrazone, 1-benzyl-1,2,3,4-tetrahydroquinoline-6-carboxaldehyde-1',1'-diphenylhydrazone, 1,3,3-trimethylindolenine-ω-aldehyde-N,N-diphenylhydrazone, p-diethylbenzaldehyde-3-methylbenzthiazolinone-2-hydazone or the like; 2,5-bis (p-diethylaminophenyl)-1,3,4-oxadiazole, a pyrazoline such as 1-phenyl-3-(p-diethylaminostyryl)-5-(p-diethylaminophenyl) pyrazoline, 1-[quinolyl(2)]-3-(p-diethylaminostyryl)-5-(p-diethylaminophenyl) pyrazoline, 1-[pyridyl(2)]-3-(p-diethylaminostyryl)-5-(p-diethylaminophenyl) pyrazoline, 1-[6-methoxypyridyl(2)]-3-(p-diethylaminostyryl)-5-(p-diethylaminophenyl) pyrazoline, 1-[pyridyl(3)]-3-(p-diethylaminostyryl)-5-(p-diethylaminophenyl) pyrazoline, 1-[lepidyl(2)]-3-(p-diethylaminostyryl)-5-(p-diethylaminophenyl) pyrazoline, 1-[pyridyl(2)]-3-(p-diethylaminostyryl)-4-methyl-5-(p-diethylaminophenyl) pyrazoline, 1-[pyridyl(2)]-3-(α-methyl-p-diethylaminostyryl)-5-(p-diethylaminophenyl) pyrazoline, 1-phenyl-3-(p-diethylaminostyryl)-4-methyl-5-(p-diethylaminophenyl) pyrazoline, 1-phenyl-3-(α-benzyl-p-diethylaminostyryl)-5-(p-diethylaminophenyl)-6-pyrazoline, spiropyrazoline or the like; an oxazole compound such as 2-(p-diethylaminostyryl)-6-diethylaminobenzoxazole, 2-(p-diethylaminophenyl)-4-(p-diethylaminophenyl)-5-(2-chlorophenyl)-oxazole or the like; a thiazole compound such as 2-(p-diethylaminostyryl)-6-diethylaminobenzothiazole or the like; a triarylmethane compound such as bis(4-diethylamino-2-methylphenyl)-phenylmethane or the like; a polyarylalkane such as 1,1-bis(4-N,N-diethylamino-2-methylphenyl) heptane, 1,1,2,2-tetrakis(4-N,N-dimethylamino-2-methylphenyl) ethane or the like; a stilben compound such as 1,1-diphenyl-p-diphenylaminoethylene or the like; a triarylamino compound such as 4,4'-3-methylphenylphenylaminobiphenyl or the like; poly-N-vinyl-carbazole, polyvinyl pyrene, polyvinyl anthracene, polyvinyl acridine, poly-9-vinylphenylanthracene, pyrene-formaldehyde resin, ethylcarbazole-formaldehyde resin, polysilylene resin such as polymethylphenylsilylene or the like may be mentioned.

It is also possible to use an inorganic material such as selenium, selenium-tellurium amorphus silicon, cadmium sulfide or the like.

The above mentioned charge transfer material may be used either signlarly or in combination of two or more kinds.

As for the resin to be used in the charge transfer layer, an insulating resin such as silicon resin, ketone resin, polymethyl methacrylate, polyvinyl chloride, acrylic resin, polyarylate, polyester, polycarbonate, polystyrene, acrylonitrile-styrene copolymer, acrylonitrile-butadiene copolymer, polyvinyl butyral, polyvinyl formal, polysulfone, polyacrylamide, polyamide, chlorinated rubber or the like; poly-N-vinylcarbazole, polyvinyl anthracene, polyvinyl pyrene or the like may be mentioned.

In order to avoid deterioration, it is possible and effective to add to the resin some usually employed additives, for example, an ultraviolet absorbent, an antioxidant, etc.

The coating may be applied by means of a spin coater, an applicator, a spray coater, a bar coater, a dip coater, a doctor blade, a roller coater, a curtain coater, a bead coater or the like so that a film having a thickness of 5-50 microns preferably 10-20 microns may be formed after drying.

In addition to these layers, it is possible to provide the conductive substrate with an undercoat layer for the purpose of preventing any reduction of electrostatic charging property and improving an adhesive property. As for such undercoat layer, an alcohol-soluble polyamide such as nylon-6, nylon-66, nylon-11, nylon-610, copolymerized nylon, alkoxymethylated nylon or the like, casein, polyvinyl alcohol, nitrocellulose, ethylene-acrylic acid copolymer, gelatin, polyurethane, polyvinyl bytyral and a metal oxide such as aluminium oxide or the like may be used. It is also effective to incorporate conductive particles of a metal oxide, carbon black or the like into a resin for use as an undercoat layer.

The photosensitive material of the present invention thus produced has an absorption peak at wavelength in the vicinity of 800 nm as seen in the spectrum sensitivity characteristic curve shown in the attached FIG. 5. It is therefore suitable for use in a copying machine and a printer as an electrophotographic photosensitive material and also in a solar battery, a photoelectric conversion element and an absorbent for a laser disc.

DESCRIPTION OF THE PREFERRED EMBODIMENTS

The present invention will be explained in further detail with reference to the embodiments shown in the following working Examples, wherein "parts" means "parts by weight".

EXAMPLE 1

20.4 parts of o-phthalonitrile and 7.6 parts of titanium tetrachloride were reacted in 50 parts of quinoline by heating at 200° C for 2 hours and then the solvent is removed by steam distillation. After purification by 2% hydrochloric acid aqueous solution and subsequently 2% sodium hydoxide aqueous solution, washing by methanol and N,N-dimethylformamide and drying, 21.3 parts of oxytitanium phthalocyanine (TiOPc) were obtained. 2 parts of this titanyl phthalocyanine were portionwise dissolved in 40 parts of 98% sulfuric acid at 5° C and the mixture was stirred at a temperature maintained at not higher than 5° C for about 1 hour. Subsequently the sulfuric acid solution was slowly poured into 400 parts of ice water stirred at a high speed and the precipitated crystal was filtrated. The crystal was washed by distilled water until no residual acid could be detected. The obtained wet cake, which was assumed to include 2 parts of phthalocyanine, was stirred in 100 parts of tetrahydrofuran (THF) for about 5 hours, filtrated, washed by THF and dried to obtain 1.7 parts of crystalline titanyl phthalocyanine.

Figure 1:
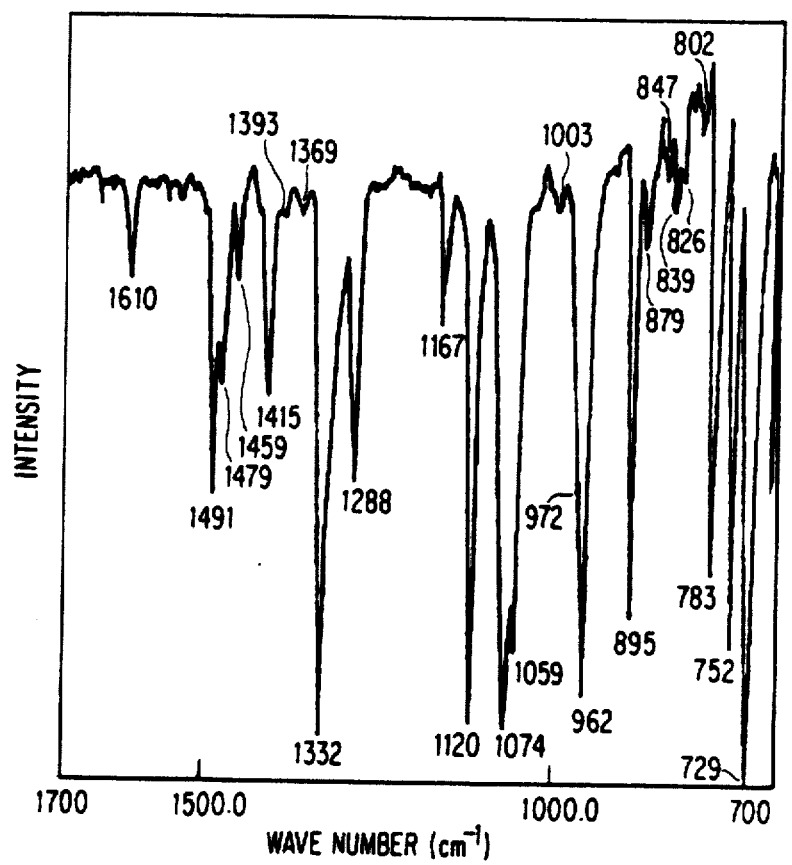
FIG. 1 shows an infrared absorption spectrum diagram of the new titanyl phthalocyanine compound of the present invention obtained in accordance with Example 1 described hereinafter.
Figure 2:
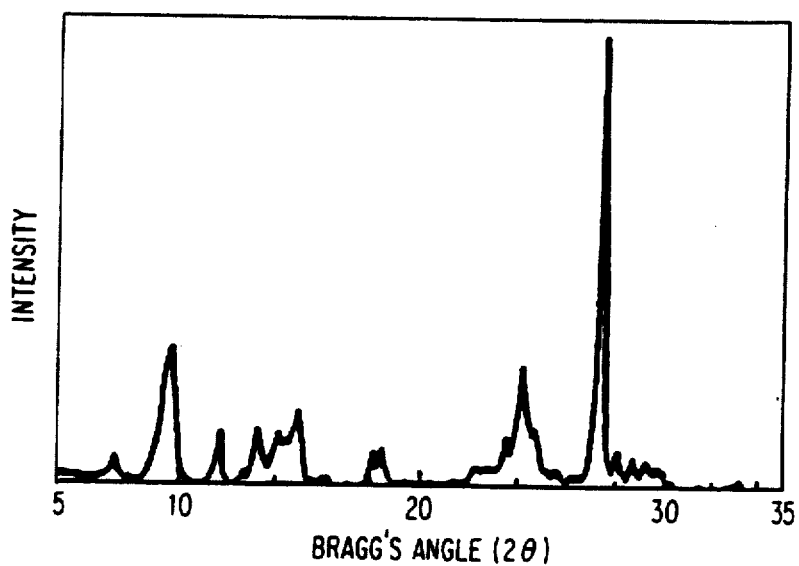
FIG. 2 shows an X-ray diffraction spectrum diagram of the same compound as that of FIG. 1.

The obtained crystalline titanyl phthalocyanine was found to have a new infrared absorption spectrum as shown in FIG. 1. Its X-ray diffraction spectrum is shown in FIG. 2. The chemical construction of the compound was confirmed by the mass spectrometry and the elementary analysis.

0.4 part of the thus obtained oxytitanium phthalocyanine was dispersed by means of a sand mill in 0.3 part of polyvinyl butyral and 30 parts of THF. The obtained dispersion was coated on a polyester film having an aluminium vacuum evaporated layer by means of a film applicator so that a film thickness of 0.2 μm may be obtained after drying at 100° C. for 1 hour. On the thus obtained charge generation layer, a charge transfer layer was formed by coating as a charge transfer agent a solution of 100 parts of diethylaminobenzaldehyde-N,N-diphenylhydrazone and 100 parts of a polycarbonate resin (Z-200; product of Mitsubishi Gas Chemical Co., Ltd., Japan) in 500 parts of 1/1 mixture of toluene and THF so that a film of thickness 15 μm might be obtained after drying.

Thus an electrophotographic photosensitive material having a laminate type photosensitive layer was obtained. A half-value exposure amount E ½ of the photosensitive material was determined by means of an electrostatic copying paper test machine (EPA-8100; product of Kawaguchi Denki Seisakusho, Japan). Namely, the photosensitive material was electrostatically charged by −5.5 KV corona discharge in a dark place and then exposed to white light of illuminance 5 lux to determine the exposure amount E ½ (lux.sec) necessary for attenuation to the half-value of the surface voltage. The result is shown in the Table 1.

EXAMPLE 2a

The procedures similar to those of the Example 1, excepting that 4-dibenzylamino-2-methylbenzaldehyde-1,1'-diphenylhydrazone was used as the charge transfer material, were repeated to determine the electrophotographic property. The result is shown in the Table 1.

EXAMPLE 2b

The procedures similar to those of the Example 2a, excepting that 2 parts of 2-hydroxy-4-methoxybenzophenone further were added, were repeated to determine the electrophotographic property. The result is shown in the Table 1.

EXAMPLE 3

The procedures similar to those of the Example 1, excepting that 1-phenyl-1,2,3,4-tetrahydroquinoline-6-carboxaldehyde-1,1'-diphenylhydrazone was used as the charge transfer material, were repeated to make evaluation of the electrophotographic property. The result is shown in the Table 1.

EXAMPLE 4a

The wet cake obtained in the Example 1 after the sulfuric acid treatment was washed by 5% hydrochloric acid, subjected to filtration and washing by water until neutral condition is obtained and dried. 0.4 part of the obtained titanyl phthalocyanine was put into a ball mill together with 30 parts of THF and dispersed for 10 hours. A portion of the dispersed product was taken out to determine X-ray diffraction pattern. The result showed a crystal form similar to that of FIG. 3. Next, 0.3 part of a polyester resin was introduced into the ball mill and further dispersed for 8 hours. The obtained dispersion was coated on an aluminium plate, on which a polyamide resin had been coated in 0.3 μm thickness, so that dry thickness of the film might be 0.3 μm. On the thus obtained charge generation layer, a charge transfer layer was formed in the manner similar to the Example 1, excepting that 1,1-p-dimethylaminobenz-4,4-diphenyl-2-butylene was used as the charge transfer agent, and the electrophotographic property of the obtained photosensitive material was determined. The result is shown in the Table 1.

EXAMPLE 4b

The procedures similar to those of the Example 4a, excepting that, in addition to 1,1-p-dimethylaminobenz-4,4-diphenyl-2-butylene used as the charge transfer agent, 4 parts of 2,4-bis (n-octylthio)-6-(4-hydroxy-3,5-di-t-butylanilino)-1,3,5-triazine were further added, and the electrophotographic property of the obtained photosensitive material was determined. The result is shown in the Table 1.

EXAMPLE 5

On the charge generation layer obtained in the manner similar to the Example 1, a charge transfer layer was formed by coating a solution of 50 parts of polymethylphenyl silylene in 100 parts of toluene so that a dry thickness of the coated film might be 12 μm. The electrophotographic property was determined in the similar manner. The result is shown in the Table 1.

EXAMPLE 6

1 part of the titanyl phthalocyanine obtained in the Example 1, 0.7 part of p-diethylaminobenzaldehyde-1,1-diphenylhydrazone and 42 parts of a solution of a polyester resin (Vailon 200; product of Toyobo Co., Ltd., Japan) in a mixed solution of THF and toluene (1/1) were mixed in a glass container together with glass beads and dispersed by means of a paint conditioner. The obtained dispersion was coated on an aluminium plate to form a film of dry thickness of 12 μm. As to the obtained single layer type electrophotographic photosensitive material, electrophotographic property was determined in the manner similar to the Example 1, excepting that the charge voltage was made to +5.5 KV. The result is shown in the Table 1.

COMPARATIVE EXAMPLES 1 AND 2

Figure 3:
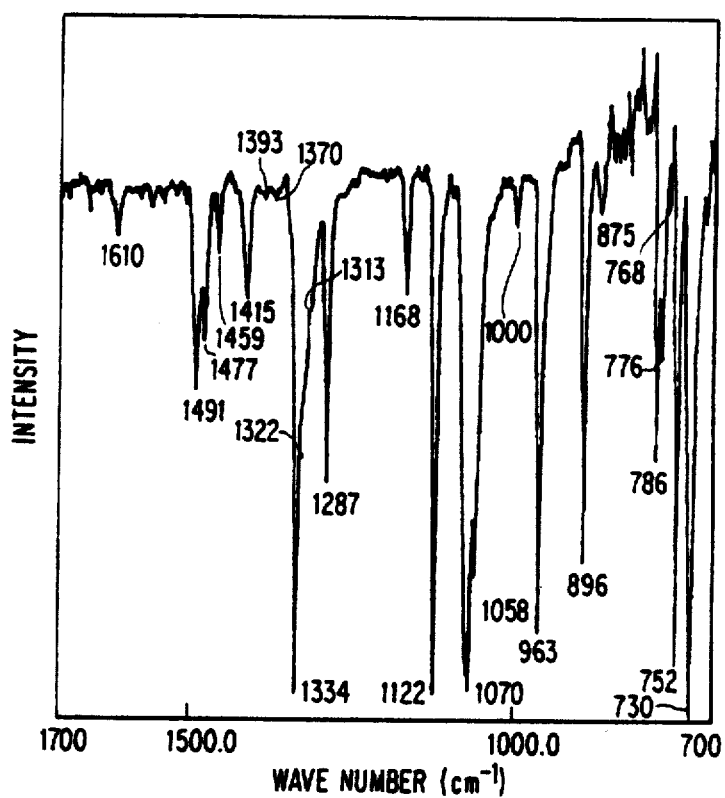
FIGS. 3 and 4 show infrared absorption spectrum diagrams of the known titanyl phthalocyanine compounds obtained in accordance with Comparative Examples 1 and 2 described hereinafter.
Figure 12:
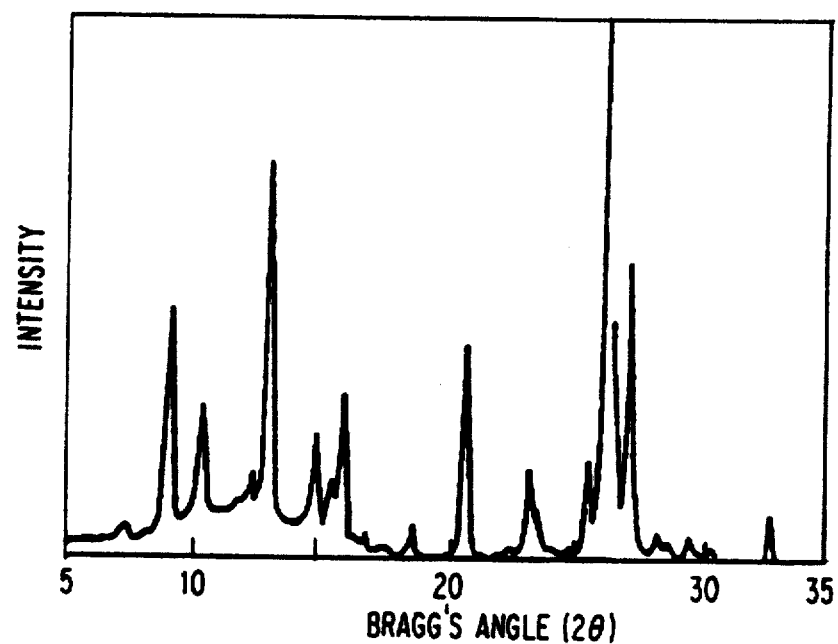
FIGS. 12 and 13 show X-ray diffraction spectrum diagrams of the known titanyl phthalocyanine compounds obtained in accordance with Comparative Examples 1 and 2 described hereinafter.

The oxytitanium phthalocyanine compound obtained in the Example 1 before the treatment with sulfuric acid is subjected to washing by N-methylpyrrolidone to obtain a crystal having the infrared absorption spectrum and the X-ray diffraction spectrum as shown in FIGS. 3 and 12, respectively [Comparative Example 1].

Figure 4:
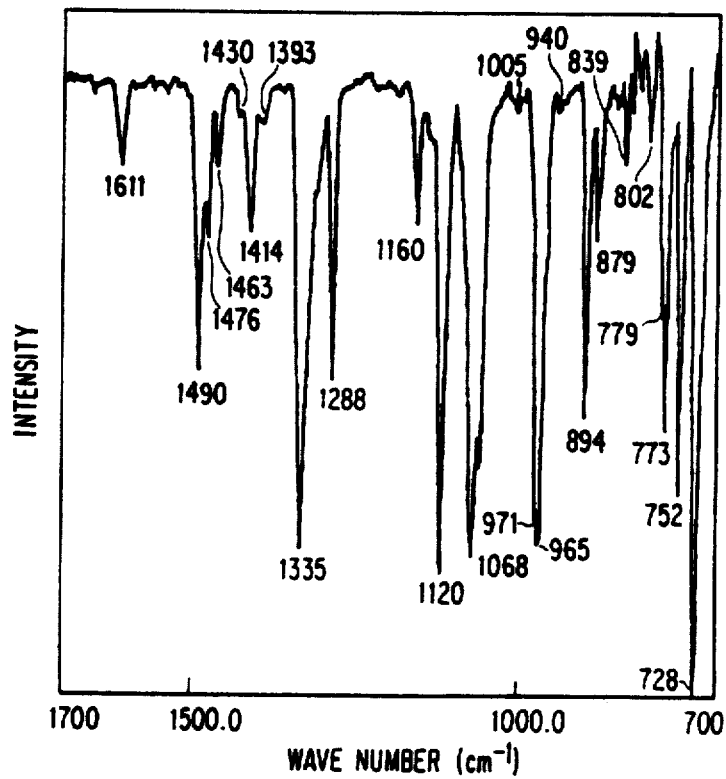
Figure 5:
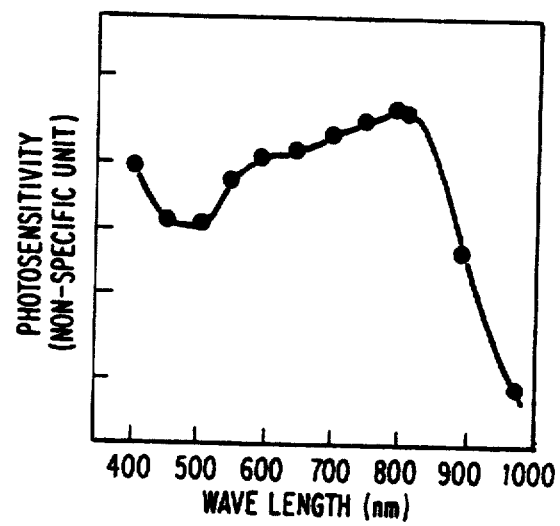
FIG. 5 shows a spectrum sensitivity characteristic curve of the photosensitive material of the present invention obtained in accordance with Examples described hereinafter.
Figure 6:
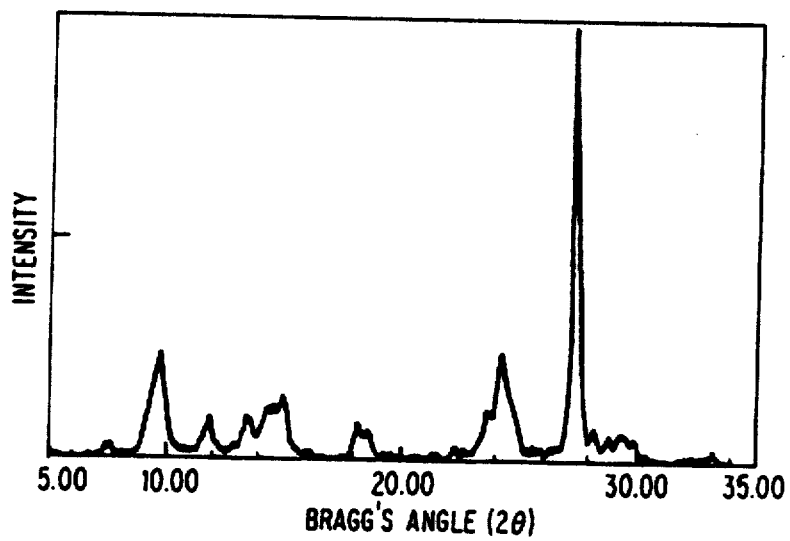
FIGS. 6–11 show X-ray diffraction spectrum diagrams of the new titanyl phthalocyanine compound of the present invention obtained in the manner similar to Example 1 described hereinafter.
Figure 7:
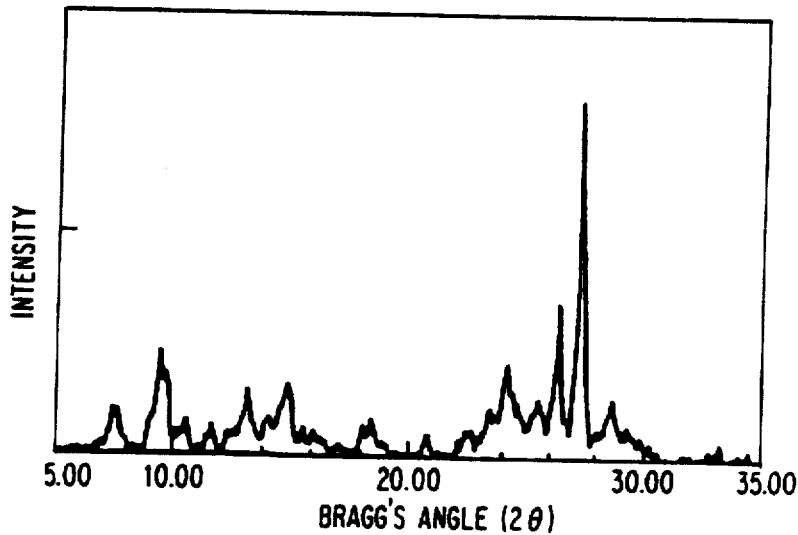
Figure 8:
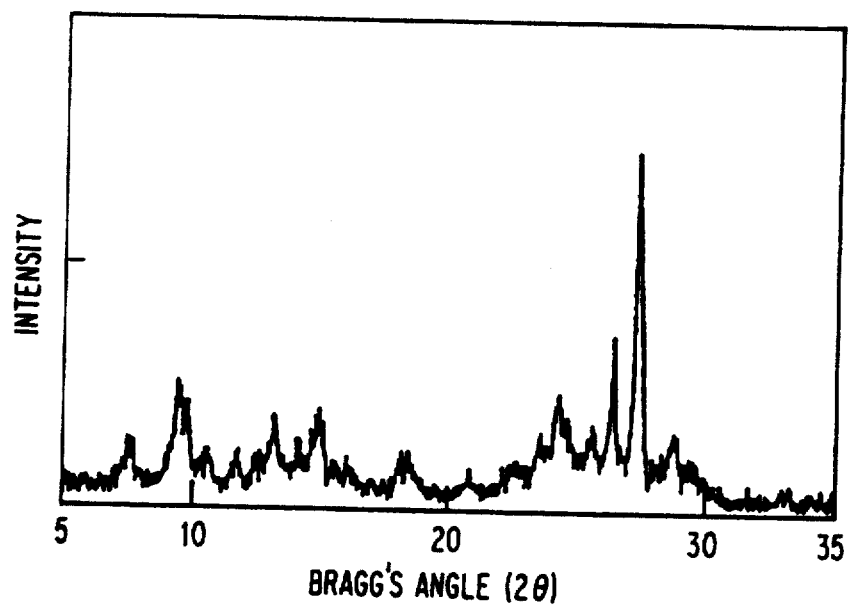
Figure 9:
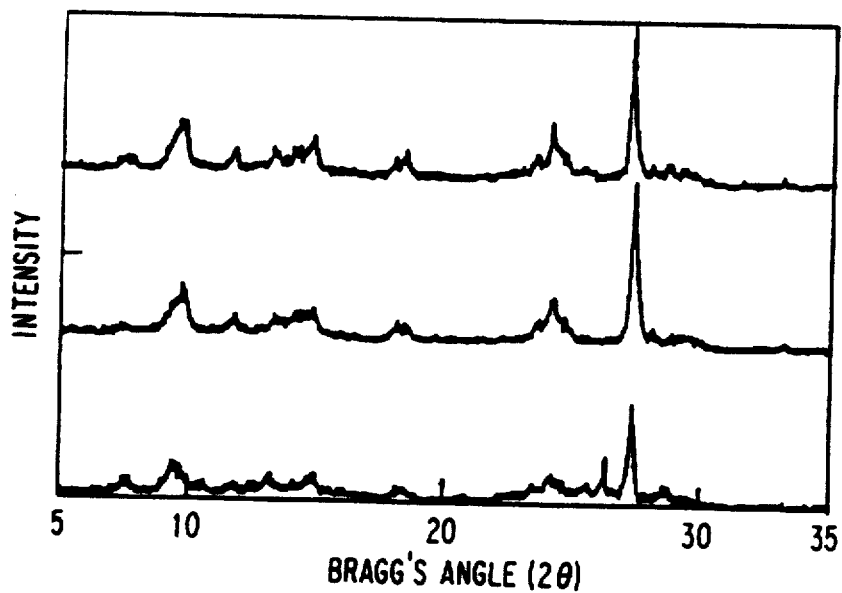
Figure 10:
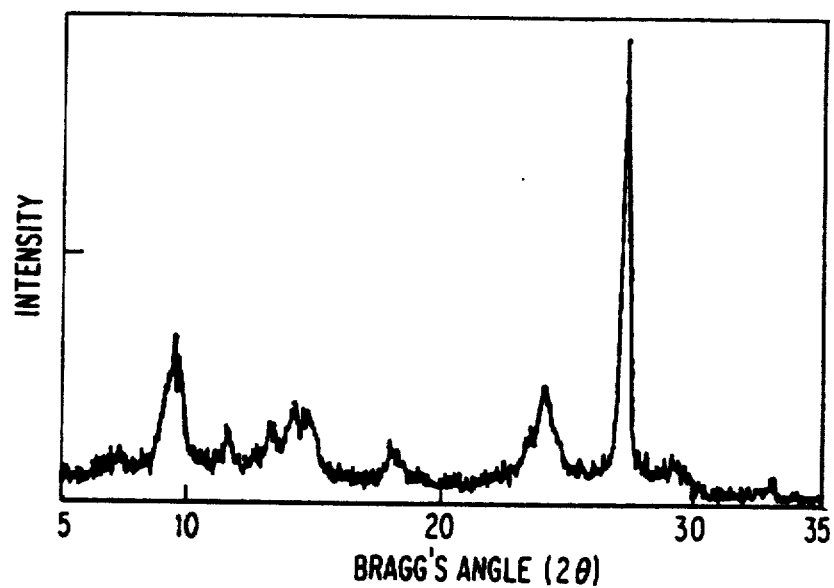
Figure 11:
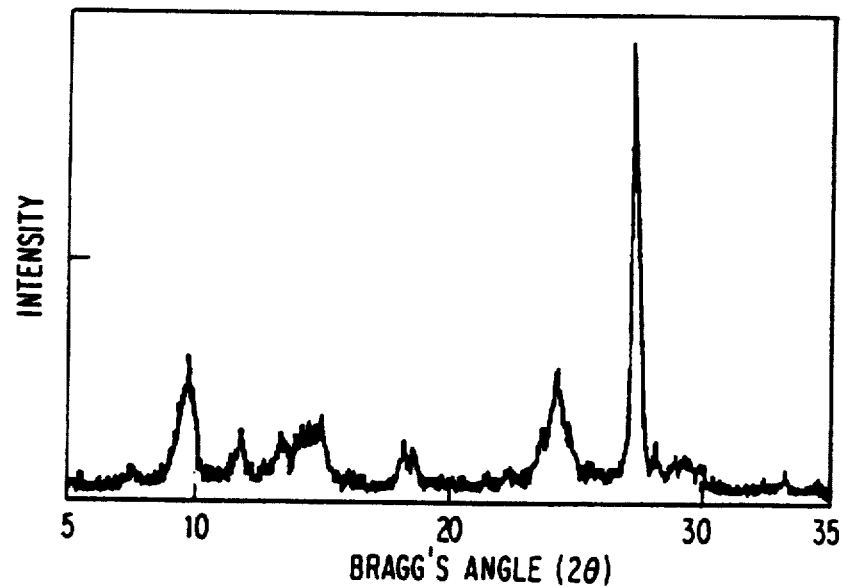
Figure 13:
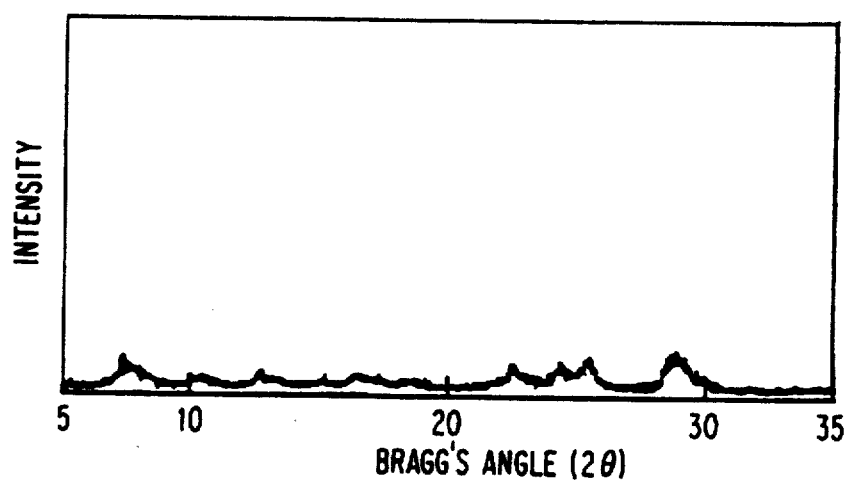

Separately, the non-crystalline phthalocyanine compound obtained in the Example just after the sulfuric acid treatment was found to have the infrared absorption spectrum and the X-ray diffraction spectrum as shown in FIGS. 4 and 13, respectively [Comparative Example 2].

By using these compounds, photosensitive materials were produced in the manner similar to the Example 1, excepting that the dispersion solvent was changed to a mixture of dichloromethane and tricholroethane (1/1), and the electrophotographic properties were determined. The results are shown in the Table 1.

TABLE 1

|  | $V_0$ (0) | $V_2/V_0$ (%) | $E_{\frac{1}{2}}$ (lux s) | $V_R$ (V) |
|---|---|---|---|---|
| Example 1 | −690 | 90 | 0.5 | −8 |
| Example 2a | −750 | 92 | 0.8 | −20 |
| Example 2b | −710 | 88 | 0.6 | −5 |
| Example 3 | −735 | 93 | 0.7 | −21 |
| Example 4a | −713 | 89 | 0.5 | −5 |
| Example 4b | −740 | 92 | 0.7 | −20 |
| Example 5 | −720 | 95 | 0.7 | −35 |
| Example 6 | +650 | 92 | 1.0 | +15 |
| Comparative Example 1 | −530 | 86 | 1.3 | −17 |
| Comparative Example 2 | −650 | 91 | 1.2 | −25 |

$V_0$: initial surface voltage
$V_2$: surface voltage after 2 sec.
$V_2/V_0$: dark attennation ratio after 2 sec.
$E_{\frac{1}{2}}$: half-value exposure amount
$V_R$: surface voltage after 5 sec. after exposure to light As explained in detail in the above, the material of the present invention is a new and stable crystal which is stable in a solvent. Therefore, when producing a coating material thereby, the selection of solvent becomes easier and the obtained coating material has a good dispersion property and a long life. Thus uniform film production, which is important for a photosensitive material, becomes easier. The obtained electrophotographic photosensitive material has high photosensitivity particularly in a semiconductor laser wavelength region and so is very effective as a photosensitive material for a highspeed high-definition printer.

We claim:

1. A phthalocyanine crystal which is represented by the general formula:

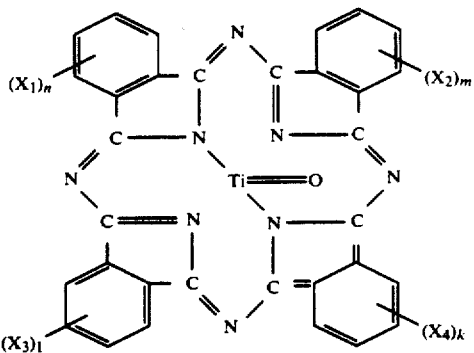

wherein $X_1$, $X_2$, $X_3$ and $X_4$ each independently represent various halogen atoms and n, m, l and k represent numerals of 0 to 4 and shows, in an infrared absorption spectrum, characteristic strong absorption peaks at $1,332\pm2$ cm$^{-1}$, $1,074\pm2$ cm$^{-1}$, $962\pm2$ cm$^{-1}$ and $783\pm2$ cm$^{-1}$.

2. The phthalocyanine crystal according to claim 1 which shows, in an X-ray diffraction spectrum, the maximum diffraction peak at 27.2° of Bragg's angle ($2\theta\pm0.2°$) and strong diffraction peaks at 9.7° and 24.1°.

3. A process for the manufacture of a phthalocyanine crystal which shows, in an infrared absorption spectrum, characteristic strong peaks at $1,332\pm2$ cm$^{-1}$, $1,074\pm2$ cm$^{-1}$, $962\pm2$ cm$^{-1}$ and $783\pm2$ cm$^{-1}$, characterized in that a non-crystalline titanyl phthalocyanine compound is treated with tetrahydrofuran.

4. A phthalocyanine crystal which is represented by the general formula:

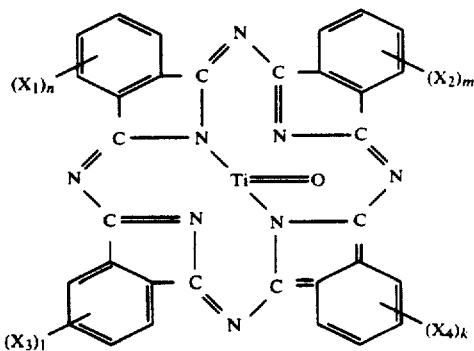

wherein $X_1$, $X_2$, $X_3$ and $X_4$ each independently represent various halogen atoms and n, m, l and k represent numerals of 0 to 4 and shows, in an X-ray diffraction using Cu-K$\bar{\alpha}$ ray, the maximum peak at 27.2° of Bragg's angle ($2\theta\pm0.2°$) and strong peaks at 9.7° and 24.1°.

5. A process for the manufacture of a phthalocyanine crystal which shows, in an X-ray diffraction spectrum, the maximum diffraction peak at 27.2° of Bragg's angle ($2\theta\pm0.2°$) and strong diffraction peaks at 9.7° and 24.1°, characterized in that a non-crystalline titanyl phthalocyanine compound is treated with tetrahydrofuran.

* * * * *

UNITED STATES PATENT AND TRADEMARK OFFICE
CERTIFICATE OF CORRECTION

PATENT NO. : 4,994,566                                Page 1 of 2

DATED      : February 19, 1991

INVENTOR(S): Yoshikazu Mimura, Tomohisa Gotou & Keiichi Takano
             (Deceased); Isao Takano, legal representative of
             Keiichi Takano It is certified that error appears in the above-identified patent and that said Letters Patent is hereby corrected as shown below:

Column 2, line 5, "Paatent" should be --Patent--.

Column 3, lines 15-30, " 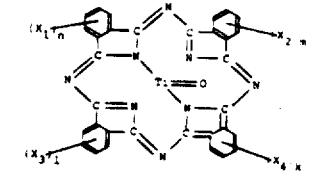 " should be

-- 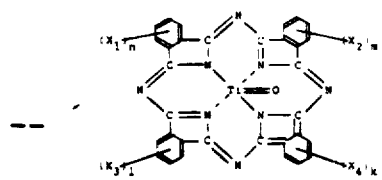 --.

Column 5, line 17, "diffratiqn" should be --diffraction--.

UNITED STATES PATENT AND TRADEMARK OFFICE
CERTIFICATE OF CORRECTION

PATENT NO. : 4,994,566

DATED : February 19, 1991

INVENTOR(S) : Yoshikazu Mimura, et al

It is certified that error appears in the above-identified patent and that said Letters Patent is hereby corrected as shown below:

Column 12, lines 1-15, " 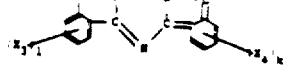 " should be

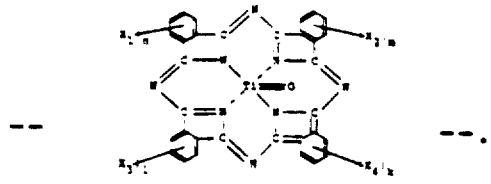

-- --.

Column 12, lines 37-50, "  " should be

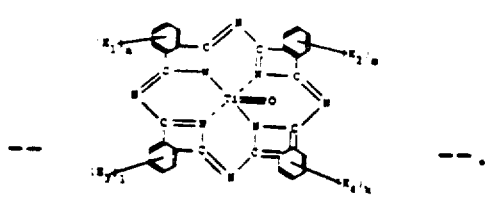

-- --.

Signed and Sealed this

First Day of September, 1992

Attest:

DOUGLAS B. COMER

Attesting Officer

Acting Commissioner of Patents and Trademarks